United States Patent [19]

Fifield et al.

[11] Patent Number: 4,459,609

[45] Date of Patent: Jul. 10, 1984

[54] CHARGE-STABILIZED MEMORY

[75] Inventors: John A. Fifield, Jericho; Lawrence G. Heller, S. Burlington; Lloyd A. Walls, Fairfax, all of Vt.

[73] Assignee: International Business Machines Corporation, Armonk, N.Y.

[21] Appl. No.: 301,563

[22] Filed: Sep. 14, 1981

[51] Int. Cl.³ .................... H01L 29/78; H01L 27/02; G11C 11/24

[52] U.S. Cl. .................... 357/23.6; 357/24; 357/41; 365/149

[58] Field of Search .................. 357/23 C, 24, 41; 365/149, 183

[56] References Cited

U.S. PATENT DOCUMENTS

| | | | |
|---|---|---|---|
| 3,387,286 | 6/1968 | Dennard | 340/173 |
| 3,720,922 | 3/1973 | Kosonocky | 340/173 R |
| 3,764,906 | 10/1973 | Heller | 324/111 |
| 3,955,101 | 5/1976 | Amelio et al. | 307/235 H |
| 4,040,017 | 8/1977 | Lee | 340/173 R |
| 4,139,910 | 2/1979 | Anantha et al. | 365/183 |
| 4,230,954 | 10/1980 | Heller | 307/238 |
| 4,240,092 | 12/1980 | Kuo | 357/23 C |
| 4,300,210 | 11/1981 | Chakravarti et al. | 357/24 |

OTHER PUBLICATIONS

R. A. Heald, D. A. Hodges, IEEE Journal of Solid-State Circuits, vol. SC-11, No. 4, Aug. 1976, "Multilevel Random-Access Memory Using One Transistor Per Cell", pp. 519-528.

*Primary Examiner*—Gene M. Munson
*Attorney, Agent, or Firm*—Stephen J. Limanek

[57] ABSTRACT

A dense memory is provided which includes a one device random access memory cell using charge fill and spill techniques wherein a potential well under a storage node is filled with charge and the excess charge above a predetermined level is spilled to a diffusion or drain region connected to a sense line through a channel region controlled by pulses on a word line. One bit or two or more bits of information may be stored in the potential well at any given instant of time. Depending upon the value of the increment of voltage applied to the storage node or electrode, a given analog charge packet is stored in a potential well formed under the storage electrode. Information is read by applying a voltage to the word line to turn on the channel region and then stepping down the voltage on the storage electrode in fractional, preferably one half, increments. Charge from a charge packet spilled from the potential well under the storage electrode is detected by a sensing circuit connected to the sense line. To rewrite information into the potential well, the original increment of voltage is applied to the storage node and the sense line is pulled to ground so that the diffusion region acts as a source of charge for the potential well.

22 Claims, 7 Drawing Figures

CHARGE-STABILIZED MEMORY

DESCRIPTION

1. Technical Field

This invention relates to integrated semiconductor circuits and more particularly to circuits for storing data in a storage medium preferably of the type having a continuum of states such as in a capacitor.

2. Background Art

Integrated semiconductor memory circuits, particularly those employing cells which include essentially only a storage capacitor and a switch, have achieved high densities. One of the simplest circuits for providing small memory cells is described in commonly assigned U.S. Pat. No. 3,387,286, filed July 14, 1967, by R. H. Dennard, wherein the switch is a single field effect transistor.

In U.S. Pat. No. 3,720,922, filed on Mar. 17, 1971, by W. F. Kosonocky, there is described a memory cell having a minority carrier storage location, a digit line and a word line disposed to provide selectively a conduction channel between the storage location and the digit line.

A detecting system which has been found to be very suitable for detecting small charges or voltages in memory cells is described in commonly assigned U.S. Pat. No. 3,764,906, filed Oct. 1, 1971, by L. G. Heller. In this detecting system, the amount of charge stored in a charge storage medium is transferred with negligible loss from the storage medium to a charge detector without regard to the size of any distributed or parasitic capacitance present on the lines, such as on a bit line.

In commonly assigned U.S. Pat. No. 4,040,017, filed Mar. 31, 1976, by H. S. Lee, there is disclosed a capacitor memory produced in a unipolar technology which is provided with very small cells, each of which includes substantially only a storage capacitor having a bit/sense line connected to one terminal of the capacitor and a word line providing a coupling to the other terminal of the capacitor. Information is stored in potential wells of cells by using charge fill and spill techniques.

Another commonly assigned U.S. Pat. No. 4,230,954, filed Dec. 29, 1978, by L. G. Heller, describes a storage system having memory cells made of devices having different threshold voltages for storing information permanently or semipermanently. The devices are arranged adjacent to each other and communicate with a diffusion region in a semiconductor substrate. Information is sensed by detecting the charge transferred from a selected cell to the diffusion region.

In order to provide memory systems which have even more dense storage of information than in the memories disclosed hereinabove, memories have been provided wherein the storage capacity is increased by utilizing multiple levels of charge in a given cell to simultaneously represent two or more digits of information. In these multilevel charge storage memories, the storage medium may store N bits of information, where N is equal to 2, 3 or more and where the number of levels is equal to $2^N$. A charge coupled device memory of this type is disclosed in commonly assigned U.S. Pat. No. 4,139,910, filed Dec. 6, 1976, by N. G. Anantha, F. Y. Chang and B. J. Rubin.

In an article entitled "Multilevel Random-Access Memory Using One Transistor Per Cell" by R. A. Heald, et. al., in IEEE Journal of *Solid-State Circuits,* Vol. SC-11, No. 4, August 1976, pp. 519 through 528, there is described a multilevel random access memory which uses junction field effect transistors, with current sensing for the detection of the information stored in these cells.

In commonly assigned U.S. patent application No. 108,242, filed on Dec. 27, 1979, by S. N. Chakravarti et. al., now U.S. Pat. No. 4,300,210 a dynamic memory is described having a sensing system for sensing charge in a storage medium, such as a storage capacitor, coupled to an access line by compensating for most sources of variability in the storage medium and in the access line. In the system, the access line is brought to a given voltage level and is permitted to float electrically. The unknown charge $Q_X$ stored in the storage medium is transferred to a first capacitor or potential well via the access line. The high charge state $Q_H$ of the storage medium is written into the storage medium and transferred to a second capacitor or potential well via the access line. Fractional packets of charge $Q_H$ are prepared and compared with the unknown charge $Q_X$ to determine the relative level of the unknown charge $Q_X$ that was stored in the storage medium.

DISCLOSURE OF THE INVENTION

It is an object of this invention to provide an improved dynamic memory cell which has tracking independence in a memory system.

It is another object of this invention to provide an improved dynamic memory cell with direct reading, requiring no dummy cells in a memory system.

It is still another object of this invention to provide an improved dynamic memory cell which uses a very small storage capacitor without sacrificing performance.

It is yet another object of this invention to provide an improved memory system having a very high cell density which does not require dummy cells.

In accordance with the teachings of this invention, a memory is provided which includes a one device random access memory cell using charge fill and spill techniques wherein a potential well under a storage node is filled with charge and the excess charge above a predetermined level is spilled to a diffusion or drain region connected to a sense line through a channel region controlled by pulses on a word line. One bit or two or more bits of information may be stored in the potential well at any given instant of time. Depending upon the value of the increment of voltage applied to a storage electrode, a given analog charge packet is stored in a potential well formed under the storage electrode. Information is read by applying a voltage to the word line to turn on the channel region and then stepping down the voltage on the storage electrode in fractional, preferably one half, increments. Charge from a charge packet spilled from the potential well under the storage electrode is detected by a sensing circuit connected to the sense line. To rewrite information into the potential well, the original increment of voltage is applied to the storage electrode and the sense line is pulled to ground so that the diffusion region acts as a source of charge for the potential well.

The foregoing and other objects, features, and advantages of the invention will be apparent from the following and more particular description of the preferred embodiments of the invention, as illustrated in the accompanying drawings.

BEST MODE FOR CARRYING OUT THE INVENTION

Figure 1:
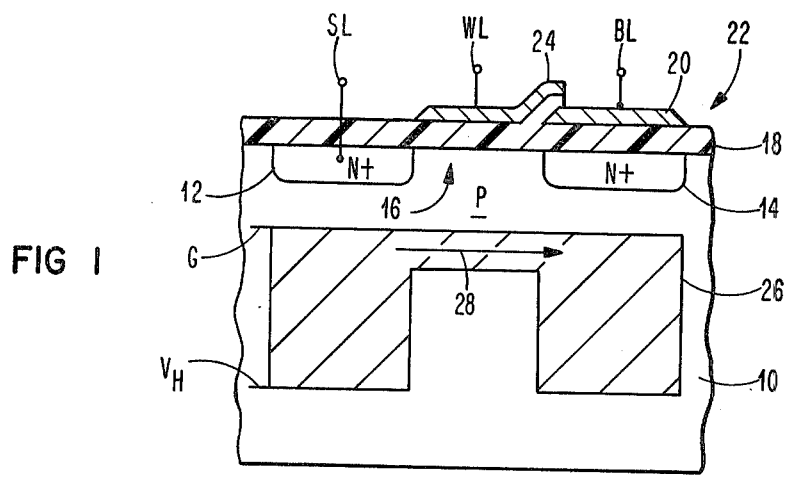
FIGS. 1, 2 and 3 are sectional views of a memory cell of the present invention with an indication of the charge stored in potential wells at various time intervals.

Referring to FIG. 1 of the drawings in more detail, there is illustrated in sectional view a memory cell of the present invention which includes a P type substrate 10 having disposed therein spaced apart first and second N+ diffusion regions 12 and 14 which define a channel region 16. A thin layer of insulation 18, e.g. silicon dioxide, is disposed on the surface of the substrate 10 with a storage electrode 20 located on the insulation layer 18 above the second diffusion region 14 to form therewith a storage capacitor 22. A control electrode 24 is located on the insulation layer 18 above the channel region 16. A sense line SL is connected to the first diffusion region 12, a word line WL is connected to the control electrode 24 and a bit line BL is connected to the storage electrode 20.

A potential well is also illustrated in FIG. 1 of the drawings under the N+ diffusion regions 12 and 14 and the channel region 16 with the lower level of the well indicated at a high voltage $V_H$ and the upper level of the well indicated at a low level or ground G. An arrow 28 in FIG. 1 indicates that the potential well under the second N+ diffusion region 14 is being filled with charge from a charge source, the first N+ diffusion region 12, after passing through the channel region 16. To fill the potential well under the second N+ diffusion region 14 with charge, in this instance, electrons, the voltage applied to the storage electrode 20 from the bit line BL is at a positive voltage $V_X$, e.g. +3 volts, with the voltage on the sense line SL being at ground and the voltage on the word line WL being at a high positive voltage $V_H$.

Figure 2:
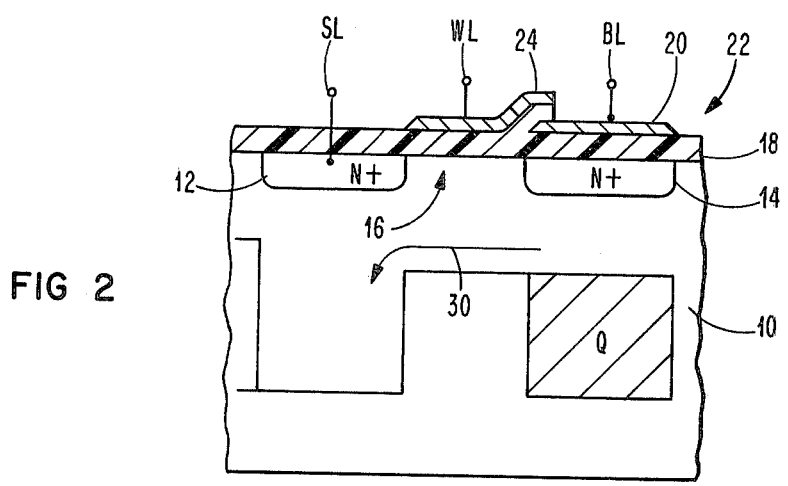

To store a given packet or predetermined level of charge in the potential well under the second N+ diffusion region 14, i.e., in the storage capacitor 22, the voltage on the first N+ diffusion region 12 is raised to a positive voltage, e.g. $V_H$, to allow the charge in the potential well under the second N+ diffusion region 14 above the charge barrier provided under the control electrode 24 to spill into the potential well formed under the first N+ diffusion region 12 as indicated by arrow 30 in FIG. 2 of the drawings. Storing the given packet of charge Q in the storage capacitor 22 indicates the storage of, e.g., a 1 digit of binary information in the cell.

To read the 1 digit of binary information stored in the cell, the sense line SL, connected to an appropriate sense amplifier, not shown, is permitted to float at an appropriate voltage such as $V_H$ and the voltage on the storage electrode 20 is decreased to $\frac{1}{2} V_X$ to spill into the potential well under the first N+ diffusion region 12 one half of the charge in the given packet of charge Q under the second N+ diffusion region 14, with the voltage $V_H$ applied to the control electrode 24. As the charge, one half of the given charge packet Q, spills into the potential well under the first N+ diffusion region 12, indicated by arrow 32 in FIG. 3 of the drawings, the voltage on the sense line SL decreases indicating that a 1 digit of binary information was stored in storage capacitor 22.

It should be noted that a 0 digit of binary information is stored in the cell by decreasing the voltage on the storage electrode 20 to zero volts or ground during the write operation, in which case no charge spills into the potential well under the first N+ diffusion region 12 during the read operation when the voltage on the storage electrode 20 is decreased to $\frac{1}{2} V_X$.

Accordingly, it can be seen that a full potential well or a charge packet Q under the second N+ diffusion region 14 indicates that a given digit of binary information is stored in the cell and that the other digit of binary information is stored in the cell when this potential well is relatively empty of charge, with sensing of this information being provided simply by an indication of a voltage change on the sense line SL when the voltage on the storage electrode 20 is reduced by a fraction, preferably $\frac{1}{2}$, of the voltage $V_X$ applied to the electrode 20 when storing the given digit in the storage capacitor 22.

Figure 3:
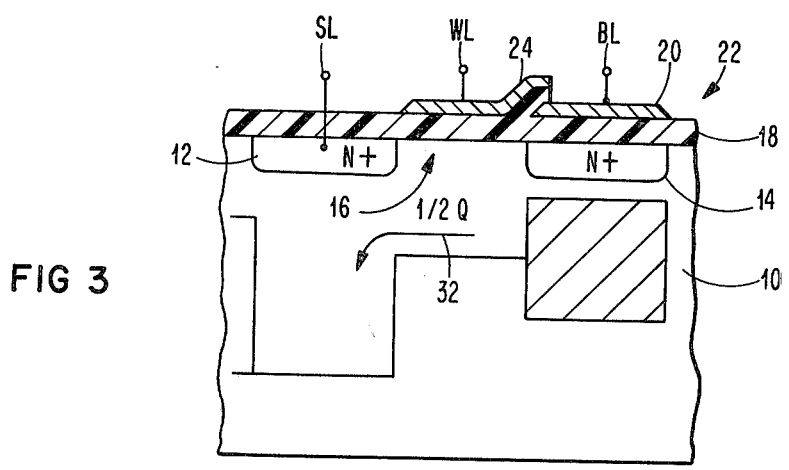
Figure 4:
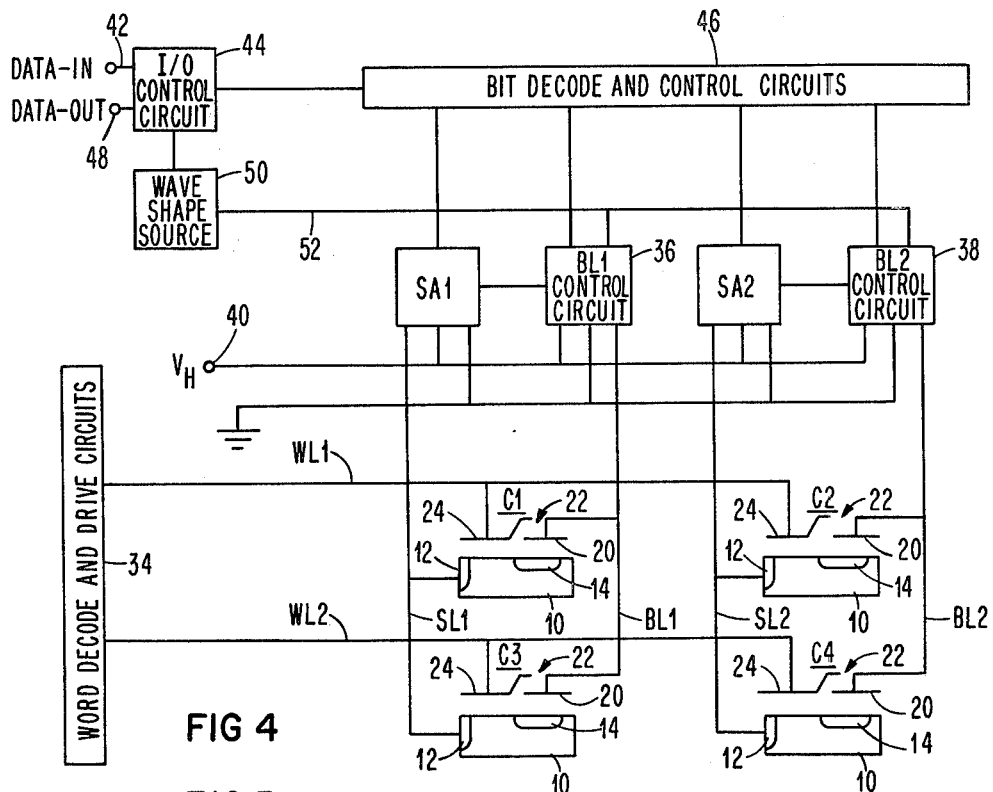
FIG. 4 illustrates a memory system of the present invention using cells of the type indicated in FIGS. 1, 2 and 3 of the drawings.

A memory system including an array of cells of the type illustrated in FIGS. 1, 2 and 3 is shown in FIG. 4 of the drawings in accordance with the teachings of this invention. Cells C1 and C2 are connected to a first word line WL1 at their control electrodes 24 and cells C3 and C4 are connected to a second word line WL2 at their control electrodes 24, with word lines WL1 and WL2 also being connected to word decode and drive circuits 34 which may be of any conventional type. Cells C1 and C3 are connected to a first sense line SL1 at their first N+ diffusion regions 12 and cells C2 and C4 are connected to a second sense line SL2 at their first N+ diffusion regions 12. The first sense line SL1 is also connected to a first sense amplifier SA1 and the second sense line SL2 is also connected to a second sense amplifier SA2. Cells C1 and C3 are also connected to a first bit line BL1 at their storage electrodes 20 and cells C2 and C4 are also connected to a second bit line BL2 at their storage electrodes 20. The first bit line BL1 is also connected to a first bit line control circuit 36 and the second bit line BL2 is also connected to a second bit line control circuit 38. A voltage $V_H$ from a terminal 40 and a ground potential are connected to the first and second sense amplifiers SA1 and SA2 and to first and second bit line control circuits 36 and 38. A data-in terminal 42 and a data-out terminal 48 are connected to first and second sense amplifiers SA1 and SA2 and to first and second bit line control circuits 36 and 38 through an I/O control circuit 44 and bit decode and control circuits 46 of any known type and to first and second bit line control circuits 36 and 38 through the I/O control circuit 44 and a wave shape source 50 and line 52. Wave shaping circuits, e.g., voltage generators, which vary the output voltage stepwise are referred to in, e.g., U.S. Pat. No. 3,955,101, filed July 29, 1974, by G. F. Amelio et al.

Figure 5:
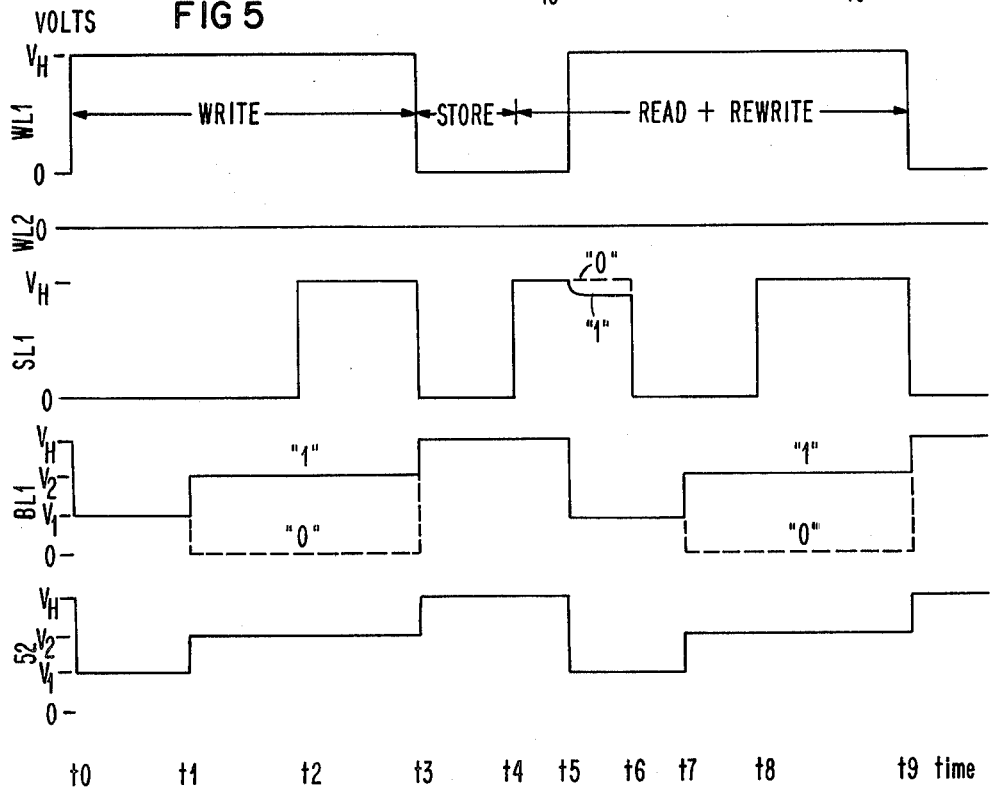
FIG. 5 is a pulse program which may be used to operate the memory system of FIG. 4 of the drawings.

To more clearly understand the operation of the memory system of the present invention illustrated in FIG. 4 of the drawings, reference may be had to the pulse program indicated in FIG. 5. Prior to time t0 in FIG. 5, the memory system is in a standby or store condition with the voltage on the first and second word lines WL1 and WL2 and on the first and second sense lines SL1 and SL2 at zero or ground potential, and the voltage on the first and second bit lines BL1 and BL2 and on line 52 at the high potential $V_H$.

To write information into the system, e.g., into cell C1, appropriate decode pulses are applied to the bit decode and control circuits 46 through the data-in terminal 42 and the I/O control circuit 44 to select the first sense amplifier SA1 and the first bit line control circuit BL1. Furthermore, the word decode and drive circuits 34 select the first word line WL1 in a known manner. At time t0, the voltage on the first word line is increased to $V_H$ and the voltage on the first bit line BL1 is decreased to a first intermediate value $V_1$, e.g., to 1.5 volts. Under these conditions, charge begins to flow from the first N+ diffusion region 12 to the potential well formed under the second N+ diffusion region 14. At time t1 the data to be stored is introduced through the data in terminal 42, I/O control circuit 44 and the bit decode and control circuits 46 to the first bit line control circuit 36. If a "1" digit of binary information is to be stored in cell C1, the stepped or increased voltage $V_2$, e.g., +3 volts, on line 52 is permitted to pass through the circuit 36 onto the first bit line BL1 to increase the depth of the potential well under the second N+ diffusion region 14. If a "0" digit of binary information is to be stored in cell C1, the stepped voltage on line 52 is not permitted to pass through the first bit line control circuit 36 and the first bit line BL1 is grounded to decrease or eliminate the potential well under the first N+ diffusion region 14 as indicated in dashed lines between times t1 and t3. It can be seen that the relatively deep potential well produced by a voltage $V_2$ contains a large charge packet Q which represents a stored "1" digit, whereas the grounded first bit line BL1, which cannot produce a deep charge storing potential well represents a "0" digit. At time t2 the voltage on the first sense line SL1 is increased to $V_H$ forcing any excess charge over the barrier produced under the control electrode 24 to be spilled into the potential well now formed under the first N+ diffusion region 12. In this manner, a very precise packet of charge Q is stored under the first N+ diffusion region 14 to represent a "1" digit and no charge packet or a smaller packet is stored under the region 14 to represent a "0" digit.

At time t3 the memory system is placed in a store or standby condition by increasing the voltage on the first bit line BL1 to $V_H$ to prevent data stored along the first bit line BL1 from being disturbed when data along other bit lines, such as bit line BL2, is being written into or read out of other cells along the same word line. During the store condition or time interval, the first word line WL1 and the first sense line SL1 are returned to zero or ground potential.

To read information from, e.g., cell C1, the voltage on the first sense line SL1 is increased to $V_H$ at time t4 and line SL1 is permitted to float electrically. At time t5, the voltage on the first word line WL1 is increased to $V_H$ and the voltage of the first bit line BL1 is decreased to voltage $V_1$. Since the voltage $V_1$ has a magnitude approximately midway between the voltage $V_2$ at which a "1" digit is stored and ground at which a "0" digit is stored, if a "1" digit is stored, one half of the charge in charge packet Q spills into the potential well under the first N+ diffusion region 12 causing the positive voltage on the first sense line SL1 to decrease, as indicated in FIG. 5 between times t5 and t6. If a "0" digit is stored, no charge will spill into the potential well under the first N+ diffusion region 12 and, therefore, the voltage on the first sense line SL1 remains at $V_H$.

Between times t6 and t9 the information is rewritten into cell C1 under the control of the the first sense amplifier SA1. When the first sense amplifier SA1 senses the presence of a "1" digit in cell C1, it permits the stepped voltage $V_2$ on line 52 to pass through the first bit line control circuit 36, however, when the first sense amplifier SA1 senses the presence of a "0" digit, it causes the first bit line control circuit 36 to ground the first bit line BL1, as indicated in dashed lines between times t7 and t9. Thus, it can be seen that the rewriting is performed substantially in the manner described hereinabove during the write portion of the accessing cycle, with spilling occurring between times t8 and t9 as it did between times t2 and t3.

The other cells of the memory system of FIG. 4 are accessed in a similar manner, e.g., cell C4 is written and read by selecting lines SL2, BL2 and WL2 and applying the corresponding voltages thereto as described hereinabove.

It should be noted that the memory system illustrated in FIG. 4 has each of its cells read directly by a sense amplifier during time interval t5 and t6 without requiring a dummy cell to provide a standard charge for determining the difference between a store "1" and a stored "0", since a precisely produced charge packet Q is stored in each particular cell and precisely spilled regardless of the size of the storage capacitor 22, even though Q may vary from cell to cell.

Figure 6:
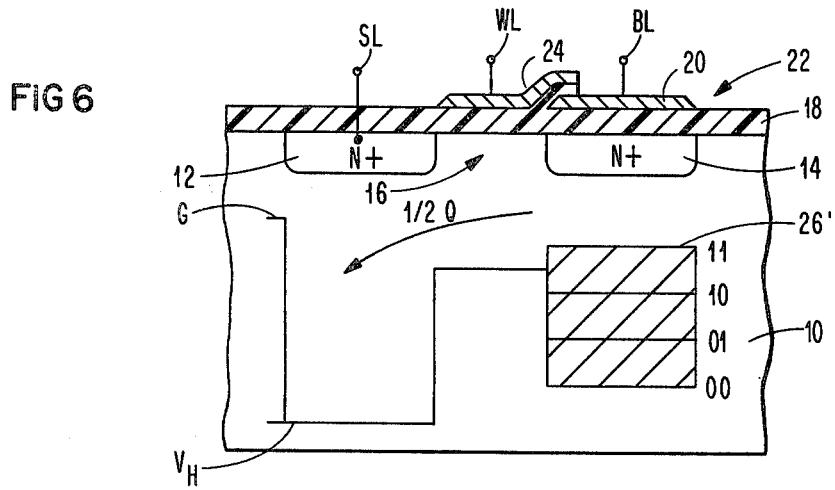
FIG. 6 is a sectional view of a memory cell of the present invention similar to that illustrated in FIGS. 1, 2 and 3, but with an indication of charge stored in a potential well representing multiple bits of information.

In FIG. 6 of the drawings there is illustrated a memory cell of the present invention which is constructed similarly to the cell shown in FIGS. 1, 2 and 3 of the drawings, but which has a pulse program applied thereto for storing two digits of binary information in the cell at a given instant of time. As indicated in FIG. 6, a potential well 26' is produced so that under the second N+ diffusion region 14 a various number of charge packets, e.g., three, may be stored therein. When no charge packet is stored in the well, the storage capacitor 22 stores two digits of binary information, e.g., "00", with one packet Q in the well "01" is stored, with two packets 2Q in the well "10" is stored and with three packets 3Q in the well "11" is stored. As illustrated in FIG. 6, when three packets of charge are stored in the potential well under region 14, the removal of one half of a packet of charge, i.e., $\frac{1}{2}$ Q indicates that the cell stored the two digits of binary information "11".

Figure 7:
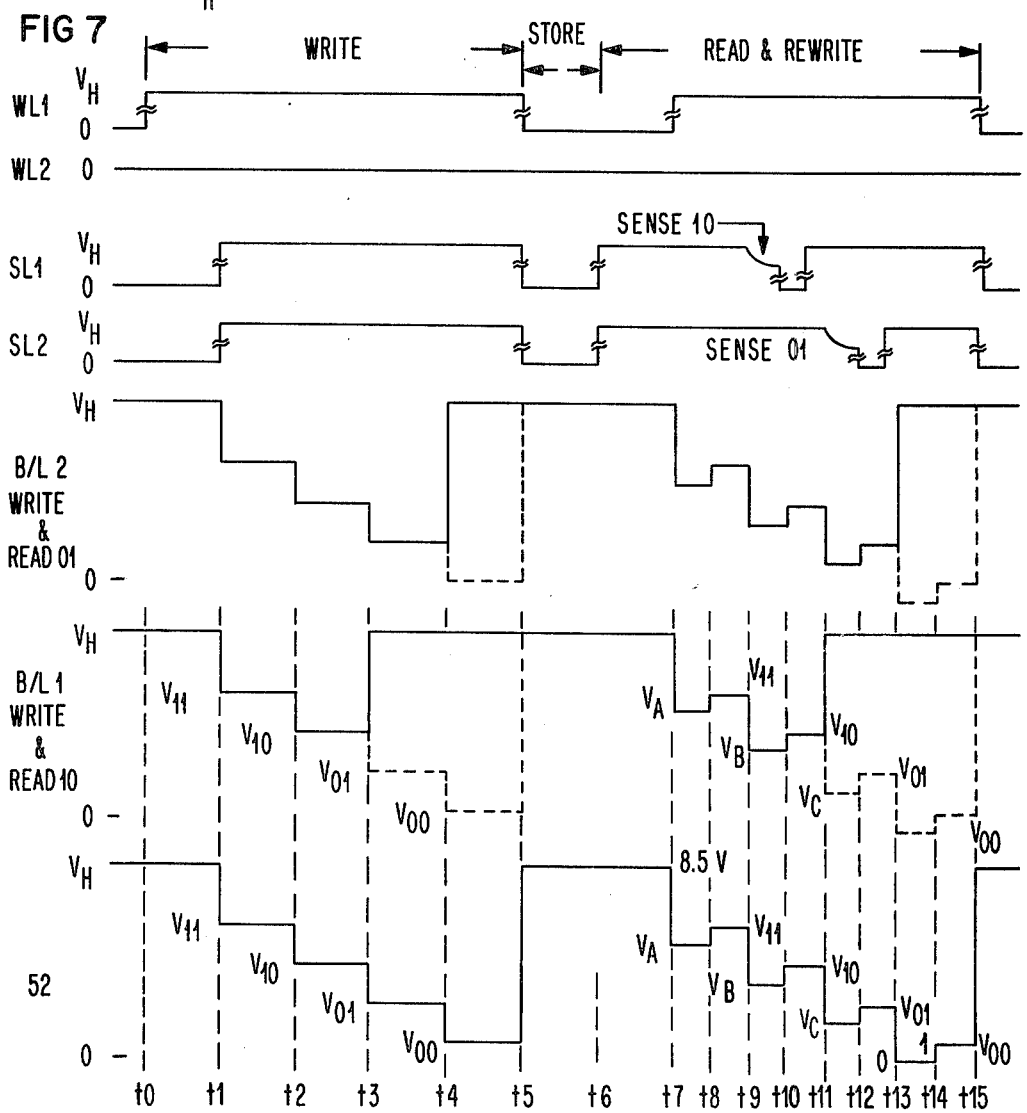
FIG. 7 is a pulse program which may be used to operate the memory system of FIG. 4 of the drawings for multiple bit cell storage.

To better understand the operation of the memory system of FIG. 4 when storing in a given cell more than one digit at a given instant of time, reference may be had to the pulse program indicated in FIG. 7 of the drawings. The wave shape source 50, indicated in FIG. 4 of the drawings, produces on line 52 a decreasing voltage from voltage $V_H$, which may be equal to 8.5 volts, to ground in several steps, as indicated in FIG. 7 at 52 between times t0 and t5 and which voltage is repeated between times t6 and t15 in modified form. Prior to time t0 in FIG. 7, the memory system is in a standby or store condition with the voltage on the first and second word lines WL1 and WL2 and on the first and second sense lines SL1 and SL2 at zero or ground potential, and the voltage on the first and second bit lines BL1 and BL2 and on line 52 at the high potential $V_H$.

To write, e.g., "10" digits of binary information into the first cell C1, appropriate decode pulses are applied to the bit decode and control circuits 46 through the data-in terminal 42 and the I/O control circuit 44 to select the first sense amplifier SA1 and the first bit line control circuit BL1. Furthermore, the word decode and drive circuits 34 select the first word line WL1, as previously described hereinabove. At time t0 the voltage on the first word line WL1 is increased to $V_H$ permitting charge to flow into the potential well under region 14 formed by voltage $V_H$ on storage electrode 20. At time t1, the voltage on the first sense line SL1 is increased to $V_H$ and the voltage on the first bit line BL1 is lowered to a voltage $V_{11}$ which reduces the size of the potential well under region 14 by an amount sufficient to spill any excess charge from that well into the potential well under the region 12. At time t2, the voltage on the first bit line BL1 is further lowered to a voltage $V_{10}$ which reduces the size of the potential well under region 14 by an amount sufficient to spill one packet of charge Q from that well into the potential well under the region 12. At this point in time, the "10" signal applied to the first bit line control circuit 36 prevents the stepped voltage on line 52 from passing through the circuit 36 and causes the voltage $V_H$ to be applied to the first bit line BL1. The voltage $V_H$ produces a deep potential well which prevents the charge stored therein to be disturbed when other cells of the system along word line WL1 are being accessed. During the store or standby period from t5 to t6, the lines WL1 and SL1 are returned to zero volts.

To read the "10" digits from cell C1, at time t6 the voltage on the first sense line SL1 is increased to $V_H$ and line SL1 is permitted to float electrically. At time t7, the voltage on the first bit line BL1 is reduced to voltage $V_A$ which is a magnitude midway between that of voltages $V_{11}$ and $V_{10}$. Since voltage $V_A$ is larger than the voltage $V_{10}$ at which charge was retained in the potential well under region 14, no charge will spill from the potential well under region 14 to the potential well under region 12. At time t8, the voltage on the first bit line BL1 is increased to $V_{11}$. At time t9, the voltage on the first bit line BL1 is reduced to voltage $V_B$ which is a magnitude midway between that of $V_{10}$ and $V_{01}$. Since voltage $V_B$ is smaller than the voltage $V_{10}$ at which charge was retained in the potential well under region 14 during the write time interval, one half of a charge packet, i.e., $\frac{1}{2}$ Q, spills from the potential well under region 14 to the potential well under region 12 where it will cause a decrease in the voltage on the first sense line SL1 indicating that digits "10" were stored in cell C1. Prior to time t10, the voltage on the first sense line SL1 is reduced to zero potential to fill the potential well under the region 14 with charge and at time t10, the voltage on the first bit line BL1 is increased to $V_{10}$ to rewrite the information into the cell C1, with excess charge being spilled prior to time t11. At time t11, under the control of the first sense amplifier SA1, the voltage on line 52 is not permitted to pass through the first bit line control circuit 36 to the first bit line BL1 and the voltage $V_H$ is applied to the first bit line BL1 after the first sense line SL1 has been returned to $V_H$.

It should be noted that the "10" digits were not only detected by applying the voltage level $V_B$ to the first bit line BL1 but also as a function of time during the read portion of the accessing cycle.

To write "01" digits into, e.g., cell C2 of FIG. 4, similar voltages as described hereinabove are applied to lines WL1, SL2 and BL2, however, as indicated in FIG. 7, the voltage on the second bit line BL2 does not rise to $V_H$ until time t4 to store only one charge packet Q in the potential well under the second N+ diffusion region 14.

When reading the "01" digits from cell C2, the charge is not spilled from the potential well under the region 14 until the voltage on the second bit line BL2 is lowered to $V_C$, i.e., midway between the voltage $V_{01}$ and $V_{00}$, during time period t11 to t12 and the charge for the "01" digits is replaced in the potential well under region 14 to rewrite the information during time period t12 to t13.

It should be noted that, if desired, information can be written into and read from cells C1 and C2 simultaneously. It should also be noted that, if desired, the second N+ diffusion region 14 may be eliminated and inversion storage techniques employed for storing data under the control electrode 20. Furthermore, by using more than three packets of charge Q in the storage capacitor 22, three or more digits of information can be stored in one cell at a given instant of time.

Although only a 2 by 2 array has been illustrated for purposes of clarity in the memory system of FIG. 4, it should be understood that one hundred or more cells may be coupled to each word line and that the system may have one hundred or more word lines, if desired.

It can be seen that in accordance with the teachings of this invention, an improved dynamic memory system has been provided which has a very high density of cells and which does not require the use of dummy cells during the read operation.

While the invention has been particularly shown and described with reference to preferred embodiments thereof, it will be understood by those skilled in the art that various changes in form and details may be made therein without departing from the spirit and scope of the invention.

What is claimed is:

1. A dynamic memory cell comprising;
  a semiconductor substrate including a first diffusion region
  a sense line connected to said diffusion region,
  storage means including a control electrode for storing charge,
  means for applying to said control electrode a first voltage having one of first and second magnitudes to form a potential well,
  means including said diffusion region for filling said potential well with charge,
  means for transferring said charge to said sense line, said transferring means including means for applying a second voltage to said control electrode having a magnitude substantially halfway between that of said first and second magnitudes, and
  means for detecting said charge on said sense line.

2. A dynamic memory cell as set forth in claim 1 wherein said storage means includes a capacitor.

3. A dynamic memory cell as set forth in claim 2 wherein said capacitor includes a second diffusion region disposed in said substrate and spaced from said first diffusion region.

4. A dynamic memory cell as set forth in claim 3 wherein said transferring means further includes means interposed between said first and second diffusion regions for controlling charge flow therebetween.

5. A dynamic memory cell as set forth in claim 4 wherein said charge filling means includes means for applying a given potential to said first diffusion region.

6. A memory array comprising;
   a semiconductor substrate having a first diffusion region,
   first and second storage capacitors disposed in said substrate, each of said capacitors having a control electrode,
   a common bit line connected to each of said electrodes,
   means for applying voltage representative of data to said bit line,
   first and second switching means, each being disposed between said diffusion region and a respective one of said capacitors, for transferring charge between said diffusion region and said first and second capacitors,
   means for selecting one of said first and second switching means and
   means connected to said first diffusion region for sensing charge flow through said selected switching means.

7. A memory array as set forth in claim 6 wherein each of said control electrodes is insulated from said substrate.

8. A memory array as set forth in claim 7 wherein each of said storage capacitors further includes a second diffusion region disposed in said substrate.

9. A memory array as set forth in claim 8 wherein each of said switching means includes a gate electrode insulated from said substrate.

10. A memory array as set forth in claim 6 wherein said voltage applying means applies a voltage having one of first and second magnitudes and further includes means for applying a second voltage having a magnitude intermediate that of said first and second magnitudes.

11. A memory array as set forth in claim 10 wherein second voltage has a magnitude substantially midway between said first and second magnitudes.

12. A memory array as set forth in claim 11 wherein said sensing means includes means for establishing a first potential at said first diffusion region during a first period of time.

13. A memory array as set forth in claim 12 further including means for applying a second potential to said first diffusion during a second period of time to provide a source of charges for said storage capacitors.

14. A memory cell comprising:
   a semiconductor substrate having a given diffusion region
   a storage capacitor having a control electrode,
   means including said given diffusion region for supplying charge to said storage capacitor,
   means including said given diffusion region for sensing charge in said capacitor,
   switching means disposed between said storage capacitor and said sensing means for controlling the flow of charge between said charge sensing means and said storage capacitor,
   means for applying to said control electrode a first voltage having one of first and second magnitudes representative of data,
   means for applying to said control electrode a second voltage having a magnitude intermediate that of said first and second magnitudes for reading said data, and
   means for applying to said control electrode a third voltage having a fourth magnitude substantially larger than any one of said first, second and third magnitudes for storing said data.

15. A memory cell comprising
   a semiconductor substrate having a first diffusion region,
   a storage capacitor having a control electrode disposed in said substrate,
   means for applying to said control electrode during a first period of time a first voltage having one of first and second magnitudes to form a potential well,
   means including said diffusion region for supplying charge to said potential well during a first portion of said first period of time,
   means for spilling any excess charge from said well to said diffusion region during a second portion of said first period of time,
   means for applying to said control electrode during a second period of time a second voltage having a third magnitude intermediate said first and second magnitudes, and
   means including said diffusion region for detecting charge spilled from said potential well during said second period of time.

16. A memory cell as set forth in claim 15 wherein said storage capacitor includes a second diffusion region spaced from said first diffusion region.

17. A memory cell as set forth in claim 16 further including means for applying to said control electrode during a third period of time intermediate said first and second periods of time a third voltage having a magnitude substantially larger than that of said first, second and third magnitudes.

18. A memory cell as set forth in claim 16 wherein said third magnitude is substantially midway between said first and second magnitudes.

19. A memory system comprising
   a semiconductor substrate,
   an array of cells disposed within said substrate, each cell including a first diffusion region, a storage capacitor and a switching device disposed between said diffusion region and said storage capacitor,
   a first word line connected to said switching device of a first and a second of said cells,
   a second word line connected to said switching device of a third and a fourth of said cells,
   a first sense amplifier connected to said diffusion regions of said first and third cells,
   a second sense amplifier connected to said diffusion regions of said second and fourth cells,
   a first bit line connected to an electrode of said storage capacitors of said first and third cells,
   a second bit line connected to an electrode of said storage capacitors of said second and fourth cells,
   means for applying to one of said bit lines during a first period of time a first voltage having one of two magnitudes,
   means for applying to one of said word lines during said first period of time and during a second period of time a word pulse,
   means for supplying charge through said switching device to said storage capacitor during said first period of time, and
   means for applying to said one bit line during said second period of time a second voltage having magnitude intermediate said two magnitudes.

20. A memory system as set forth in claim 19 wherein each of said storage capacitors includes a second diffusion region.

21. A memory system as set forth in claim 19 wherein said first voltage has one of at least four different magnitudes and said second voltage has a magnitude intermediate two adjacent magnitudes of said four magnitudes.

22. A memory system as set forth in claim 21 wherein said second voltage has a magnitude substantially midway between two adjacent magnitudes of said four magnitudes.

* * * * *